(12) United States Patent
Kawasaki et al.

(10) Patent No.: US 12,439,575 B2
(45) Date of Patent: *Oct. 7, 2025

(54) BULK FEEDER AND COMPONENT MOUNTING MACHINE

(71) Applicant: FUJI CORPORATION, Chiryu (JP)

(72) Inventors: Yuji Kawasaki, Nagoya (JP); Yusuke Yamazaki, Chiryu (JP); Shingo Aoki, Tougou-cho (JP); Satoshi Osaki, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 602 days.

This patent is subject to a terminal disclaimer.

(21) Appl. No.: 17/776,647

(22) PCT Filed: Nov. 14, 2019

(86) PCT No.: PCT/JP2019/044789
§ 371 (c)(1),
(2) Date: May 13, 2022

(87) PCT Pub. No.: WO2021/095218
PCT Pub. Date: May 20, 2021

(65) Prior Publication Data
US 2022/0400589 A1 Dec. 15, 2022

(51) Int. Cl.
*H05K 13/02* (2006.01)
*G06T 1/00* (2006.01)
(Continued)

(52) U.S. Cl.
CPC ......... *H05K 13/028* (2013.01); *G06T 1/0007* (2013.01); *H05K 13/043* (2013.01); *H05K 13/0813* (2018.08)

(58) Field of Classification Search
CPC .. G06T 1/0007; H05K 13/028; H05K 13/043; H05K 13/0813
See application file for complete search history.

(56) References Cited

U.S. PATENT DOCUMENTS

| 5,099,522 | A | 3/1992 | Morimoto | |
|---|---|---|---|---|
| 12,035,479 | B2 * | 7/2024 | Yamazaki | ............ H05K 13/043 |

(Continued)

FOREIGN PATENT DOCUMENTS

| JP | 57-43488 B2 | 9/1982 |
|---|---|---|
| JP | 2000-34011 A | 2/2000 |

(Continued)

OTHER PUBLICATIONS

International Search Report issued Feb. 10, 2020 in PCT/JP2019/044789 filed on Nov. 14, 2019, 3 pages.

*Primary Examiner* — Minh N Trinh
(74) *Attorney, Agent, or Firm* — Oblon, McClelland, Maier &Neustadt, L.L.P.

(57) ABSTRACT

A bulk feeder includes a feeder main body, a track member having a reception region in which multiple components discharged from a component case accommodating the components in a bulk state are received, a supply region to which the components are supplied, and a conveyance path of the components from the reception region to the supply region, a vibration device configured to apply vibration to the track member such that the components on the conveyance path are conveyed, and an alignment member configured to guide the multiple components conveyed by the vibration of the track member and align the components with respect to the feeder main body.

14 Claims, 9 Drawing Sheets

(51) Int. Cl.
  *H05K 13/04* (2006.01)
  *H05K 13/08* (2006.01)

(56) References Cited

U.S. PATENT DOCUMENTS

| | | | |
|---|---|---|---|
| 2012/0305585 A1* | 12/2012 | Nagao | H05K 13/0417 493/405 |
| 2018/0049352 A1 | 2/2018 | Matsumoto et al. | |
| 2019/0276173 A1 | 9/2019 | Takeuchi | |
| 2022/0400589 A1* | 12/2022 | Kawasaki | H05K 13/0813 |

FOREIGN PATENT DOCUMENTS

| | | |
|---|---|---|
| JP | 2000-236195 A | 8/2000 |
| JP | 2007-768 A | 1/2007 |
| JP | 2009-105363 A | 5/2009 |
| JP | 2011066222 A * | 3/2011 |
| JP | 2011-114084 A | 6/2011 |
| WO | WO 2016/139742 A1 | 9/2016 |
| WO | WO 2018/105591 A1 | 6/2018 |

* cited by examiner

BULK FEEDER AND COMPONENT MOUNTING MACHINE

TECHNICAL FIELD

The present disclosure relates to a bulk feeder and a component mounting machine.

BACKGROUND ART

A bulk feeder is mounted on a component mounting machine that mounts components on a board, and is used for supplying the components accommodated in a bulk state. There is a type of bulk feeder in which multiple components are supplied in a state of being aligned in a row by an alignment mechanism provided on a conveyance path, for example. In addition, as disclosed in Patent Literature 1, there is a type of bulk feeder in which the alignment mechanism as described above is omitted and the components are supplied in the bulk state in which the components are scattered in a supply region where the components can be collected by a suction nozzle.

PATENT LITERATURE

Patent Literature 1: JP-A-2011-114084

BRIEF SUMMARY

Technical Problem

In a case of a bulk feeder of the type that supplies multiple components in the bulk state to supply region as described above, the component mounting machine recognizes the supply state of the components by using the image data acquired by imaging the supply region. In this case, in the image processing, it is necessary to determine whether the component can be collected for each of multiple components, and to calculate the position and the angle of the components in a case where the components can be collected. Therefore, there is a concern that the load of the image processing will be increased. In addition, the bulk feeder is particularly desired to reduce a size in a width direction.

The present description is to provide a bulk feeder capable of suitably supplying multiple components while reducing a size in a width direction and reducing a load of recognition processing of a supply state of the components in a supply region, and a component mounting machine including the bulk feeder described above.

Solution to Problem

The present description discloses a bulk feeder including a feeder main body, a track member provided in the feeder main body and having a reception region in which multiple components discharged from a component case accommodating the components in a bulk state are received, a supply region to which the components are supplied, and a conveyance path of the components from the reception region to the supply region, a vibration device provided in the feeder main body and configured to apply vibration to the track member such that the components on the conveyance path are conveyed, and an alignment member provided in the supply region of the track member and configured to align the multiple components conveyed by the vibration of the track member with respect to the feeder main body.

Advantageous Effects

With such a configuration, since the components are efficiently aligned in the supply region, it is possible to supply the bulk feeder to be able to suitably collect multiple components while reducing the size in the width direction. In addition, since the components are aligned in the supply region, the load of the recognition processing of the supply state can be reduced as compared with the bulk state.

DESCRIPTION OF EMBODIMENTS

1. Configuration of Component Mounting Machine 10

Component mounting machine 10 configures a production line for producing a board product together with multiple types of board work machines including, for example, another component mounting machine 10. The board work machine configuring the production line described above can include a printer, an inspection device, a reflow furnace, or the like.

1-1. Board Conveyance Device

Figure 1:
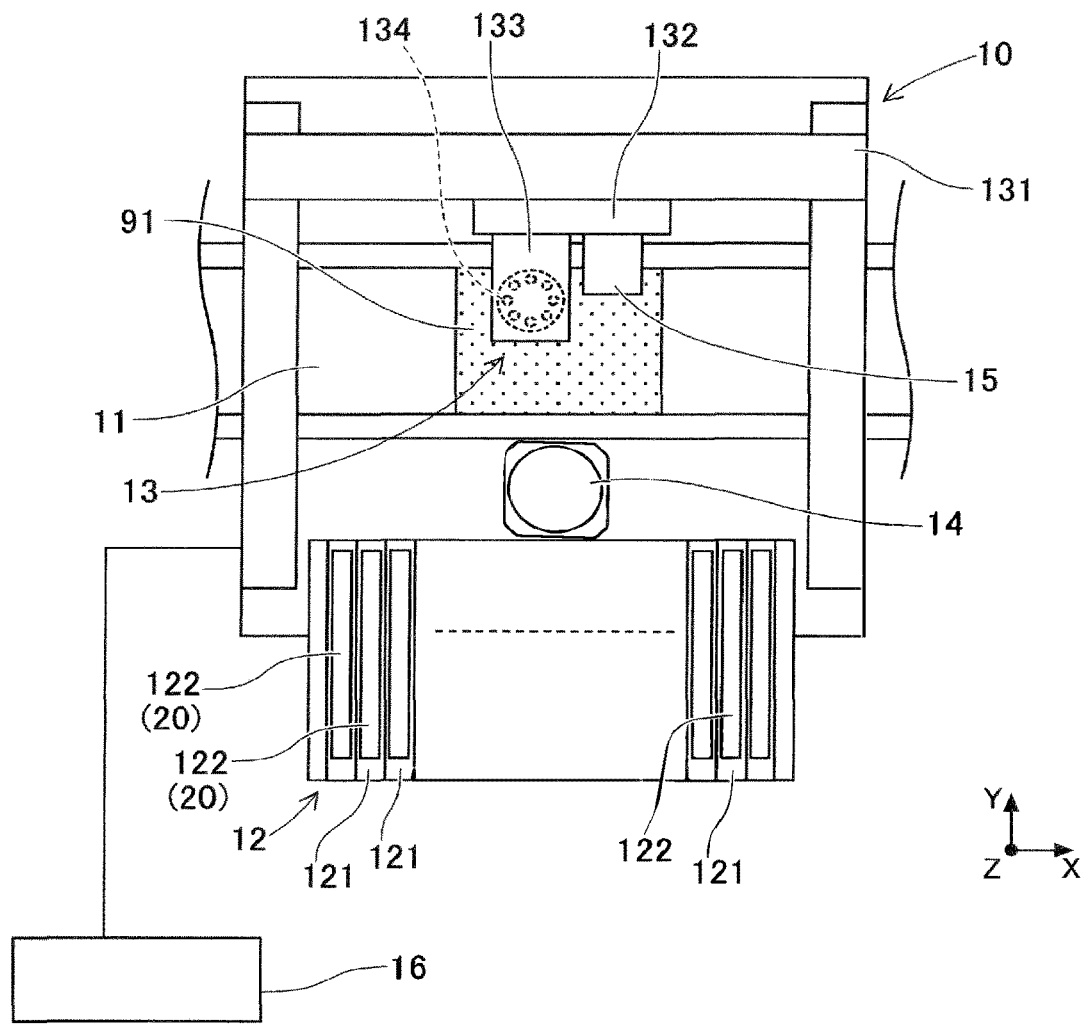
FIG. 1 is a schematic view showing a configuration of a component mounting machine.

As shown in FIG. 1, component mounting machine 10 includes board conveyance device 11. Board conveyance device 11 sequentially conveys board 91 in a conveyance direction, and positions board 91 at a predetermined position in the machine.

1-2. Component Supply Device 12

Component mounting machine 10 includes component supply device 12. Component supply device 12 supplies components to be mounted on board 91. Component supply device 12 is equipped with feeder 122 in each of multiple slots 121. Feeder 122 includes a tape feeder that supplies the components to be collectable, for example, by feeding and moving a carrier tape accommodating a large number of components. In addition, feeder 122 includes bulk feeder 20 that supplies the components accommodated in a bulk state (in a loose state in which each posture is irregular) to be collectable. Details of bulk feeder 20 will be described below.

1-3. Component Transfer Device 13

Component mounting machine 10 includes component transfer device 13. Component transfer device 13 transfers the components supplied by component supply device 12 to a predetermined mounting position on board 91. Component transfer device 13 includes head driving device 131, moving table 132, mounting head 133, and suction nozzle 134. Head driving device 131 moves moving table 132 in a horizontal direction (X-direction and Y-direction) by a linear motion mechanism. Mounting head 133 is detachably fixed to moving table 132 by a clamp member (not shown), and is provided to be movable in the horizontal direction in the machine.

Mounting head 133 supports multiple suction nozzles 134 to be able to be rotated and raised and lowered. Suction nozzle 134 is a holding member that collects and holds component 92 supplied by feeder 122. Suction nozzle 134 picks up the components supplied by feeder 122 by supplied negative pressure air. As the holding member attached to mounting head 133, a chuck or the like that holds the components by gripping the components can be adopted.

Here, as mounting head 133 described above, various types can be adopted. Specifically, as mounting head 133, there is a type in which multiple holding members are supported by a rotary head provided to be rotatable around an R-axis parallel to a vertical axis (Z-axis). In the present embodiment, mounting head 133 supports 24 suction nozzles 134 by the rotary head. In addition, as mounting head 133, there are a type in which the multiple holding members arranged linearly or in a matrix are supported, a type in which one holding member is supported, and the like. The type of mounting head 133 can be appropriately selected in accordance with, for example, a type of board product to be produced.

1-4. Part Camera 14 and Board Camera 15

Component mounting machine 10 includes part camera 14 and board camera 15. Part camera 14 and board camera 15 are digital imaging devices having imaging elements, such as a CMOS. Part camera 14 and board camera 15 execute imaging based on control signals and send image data acquired by the imaging. Part camera 14 is configured to image the components held by suction nozzle 134 from below. Board camera 15 is provided on moving table 132 to be movable in the horizontal direction integrally with mounting head 133. Board camera 15 is configured to image board 91 from above.

In addition to using a surface of board 91 as an imaging target, board camera 15 can use various devices and the like as the imaging target as long as various devices are within a movable range of moving table 132. For example, in the present embodiment, board camera 15 can image supply region As (see FIG. 4) to which bulk feeder 20 supplies components 92. As described above, board camera 15 can be used for imaging different imaging targets to acquire the image data used for various pieces of image processing.

1-5. Control Device 16

Component mounting machine 10 includes control device 16. Control device 16 is mainly composed of CPU, various memories, or a control circuit. Control device 16 includes a storage device (not shown). The storage device is composed of an optical drive device, such as a hard disk device or a flash memory. The storage device of control device 16 stores various data, such as a control program used for controlling a mounting process. The control program indicates the mounting position and a mounting order of the components mounted on board 91 in the mounting process.

Control device 16 executes recognition processing of a holding state of the component held by each of multiple holding members (suction nozzles 134). Specifically, control device 16 executes the image processing on the image data acquired by the imaging of part camera 14 and recognizes a position and an angle of each component with respect to a reference position of mounting head 133. It should be noted that, in addition to part camera 14, control device 16 may execute the image processing on the image data acquired by imaging the components by a head camera unit or the like provided integrally with mounting head 133 from side, below, or above.

Control device 16 controls a mounting operation of the components by mounting head 133 based on the control program to execute the mounting process. Here, the mounting process includes a process of repeating a pick-and-place cycle (hereinafter, referred to as "PP cycle") including a collection operation and the mounting operation multiple times. The "collection operation" described above is an operation of collecting the components supplied by component supply device 12 by suction nozzle 134.

In the present embodiment, in a case where the collection operation described above is executed, control device 16 controls the operation of component supply device 12 including bulk feeder 20 and executes recognition processing of a supply state of components 92 in supply region As of bulk feeder 20. The "recognition processing of the supply state" described above includes processing of recognizing whether components 92 that can be collected are present in supply region As, and recognizing the positions of components 92 in a case where components 92 are present, as needed. Moreover, control device 16 controls an operation of mounting head 133 in the collection operation based on a result of the recognition processing of the supply state.

In addition, the "mounting operation" described above is an operation of mounting the collected components at the predetermined mounting position on board 91. In the mounting process, control device 16 controls the operation of mounting head 133 based on information output from various sensors, the result of image processing, a control program, or the like. As a result, the positions and the angles of multiple suction nozzles 134 supported by mounting head 133 are controlled.

2. Configuration of Bulk Feeder 20

Bulk feeder 20 is mounted on component mounting machine 10 and functions as at least a part of component supply device 12. Since, unlike the tape feeder, bulk feeder 20 does not use the carrier tape, there is an advantage in that loading of the carrier tape, collection of used tape, or the like can be omitted. On the other hand, since bulk feeder 20 supplies components 92 accommodated in the bulk state which are not aligned like the carrier tape, the supply state of components 92 can affect the collection operation by the holding member, such as suction nozzle 134.

Specifically, in a case where components 92 are close enough to be in contact with each other or are deposited (state of overlapping in the up-down direction) in supply region As, components 92 cannot be used as a collection target. In addition, in a case where components 92 are supplied to supply region As in an irregular posture, the image processing of recognizing the supply state (whether components 92 can be collected and posture of components 92 that can be collected) is required. Therefore, it is desired that bulk feeder 20 be in a state of being supplied with multiple components 92 that can be collected in supply region As without being insufficient in the required number, and is further appropriately dispersed.

On the other hand, it is assumed that bulk feeder 20 adopts a configuration in which multiple components 92 are aligned in a row by, for example, an alignment mechanism provided on a conveyance path before components 92 reach supply region As. However, in the configuration described above, it is necessary to provide the alignment mechanism on the conveyance path, and it is further necessary to maintain an aligned state and convey components 92 to supply region As. Therefore, bulk feeder 20 of the present embodiment adopts a configuration in which components 92 are conveyed by using vibration and components 92 are aligned by using the vibration in supply region As.

2-1. Feeder Main Body 21

Figure 2:
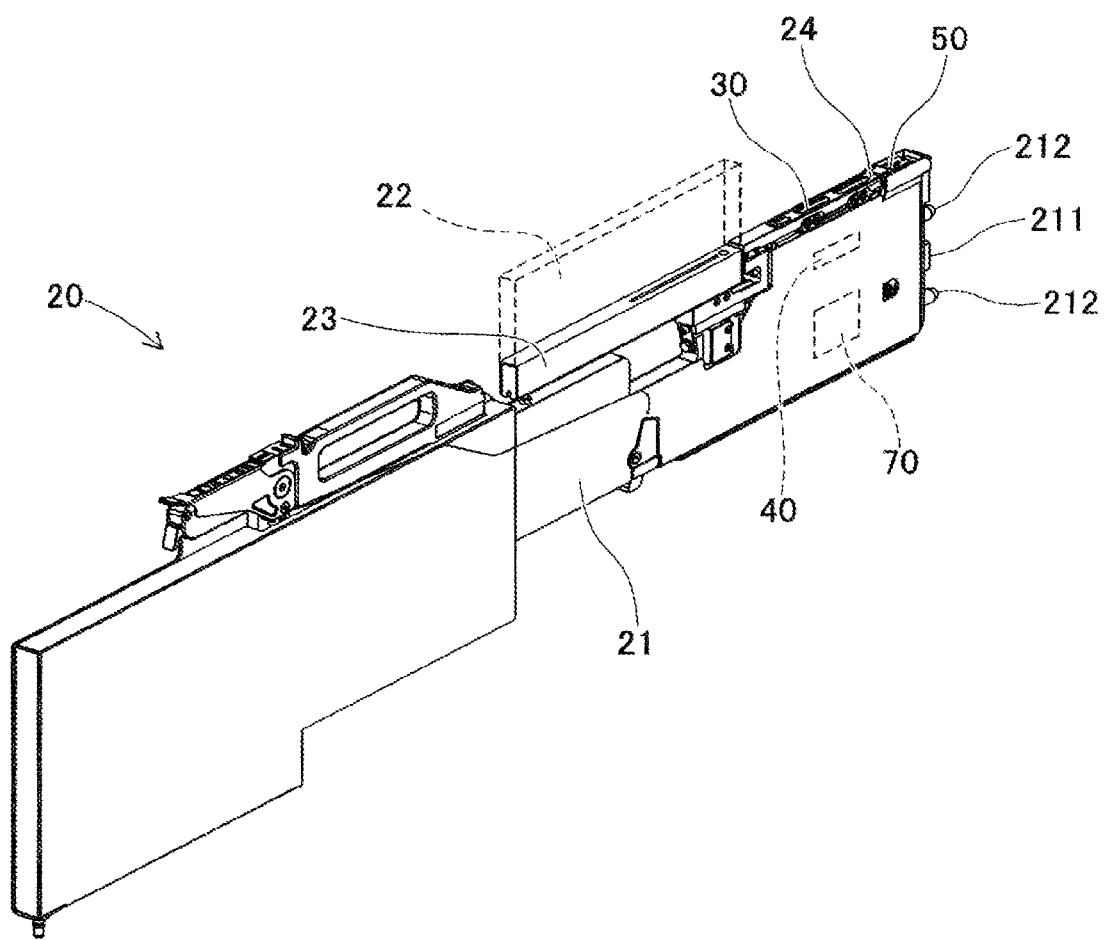
FIG. 2 is a perspective view showing an appearance of a bulk feeder.

As shown in FIG. 2, bulk feeder 20 includes feeder main body 21. Feeder main body 21 is formed in a flat box shape. Feeder main body 21 is set in slot 121 of component supply device 12. Connector 211 and two pins 212 are formed on a front part of feeder main body 21. In a case where bulk feeder 20 is set in slot 121, connector 211 is communicably connected to a main body side of component mounting machine 10. In addition, bulk feeder 20 is supplied with power via connector 211. Two pins 212 are used for positioning in a case where feeder main body 21 is set in slot 121.

2-2. Component Case 22, Discharge Device 23, and Cover 24

In the present embodiment, component case 22 accommodating multiple components 92 in the bulk state is detachably attached to feeder main body 21. Component case 22 is configured to discharge components 92 to the outside. In the present embodiment, component case 22 is an external device of bulk feeder 20, for example, one of various types suitable for the mounting process is selected and attached to feeder main body 21.

Bulk feeder 20 includes discharge device 23. Discharge device 23 adjusts the number of components 92 discharged from component case 22. Discharge device 23 supplies multiple components 92 discharged from component case 22 to reception region Ar of track member 30, which will be described below. Bulk feeder 20 includes cover 24. Cover 24 is detachably attached to a front upper part of feeder main body 21. Cover 24 prevents components 92 conveyed along conveyance path R of track member 30, which will be described below, from scattering to the outside.

2-3. Track Member 30

Figure 3:
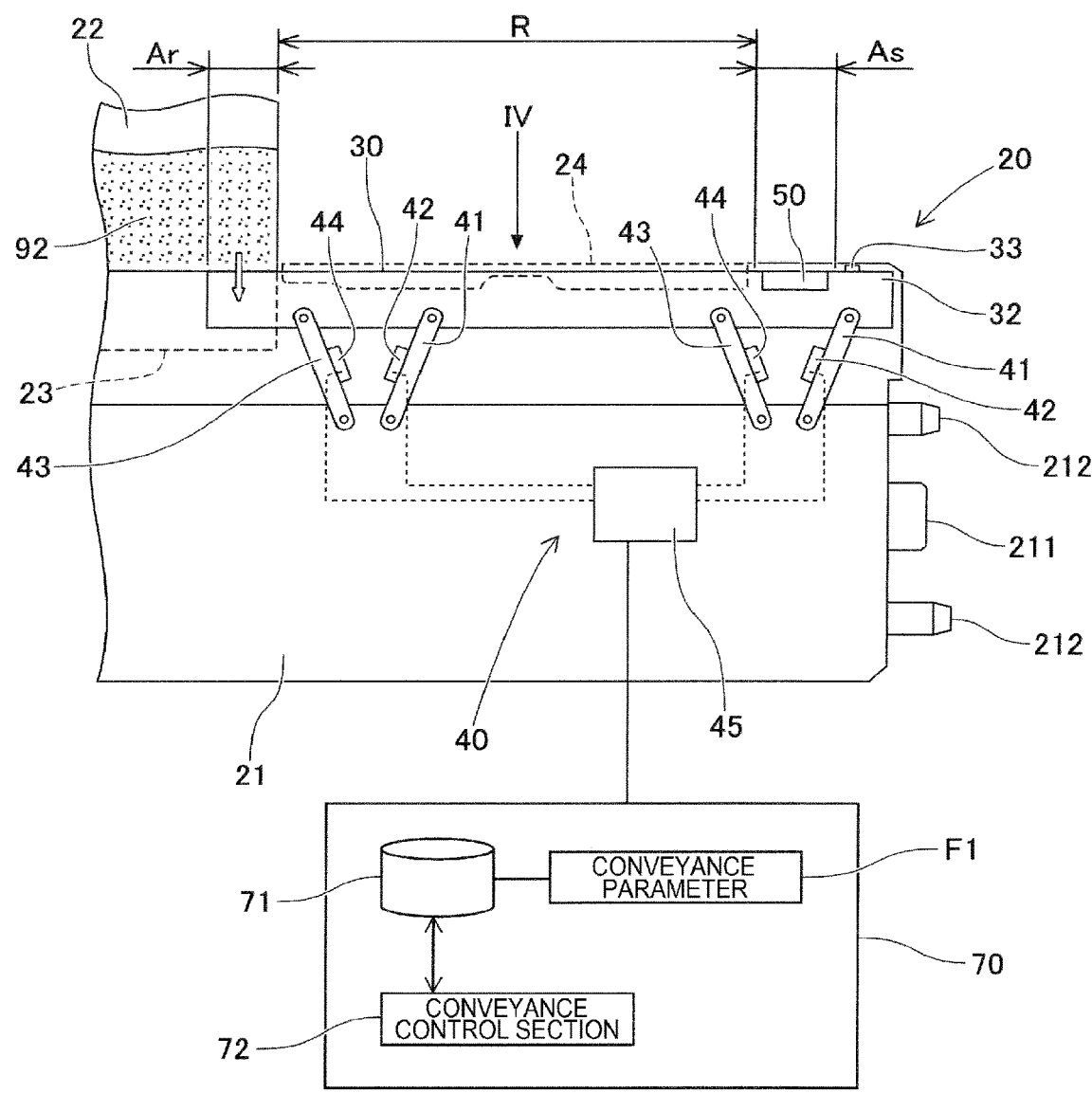
FIG. 3 is a side view schematically showing a main part of the bulk feeder.
Figure 4:
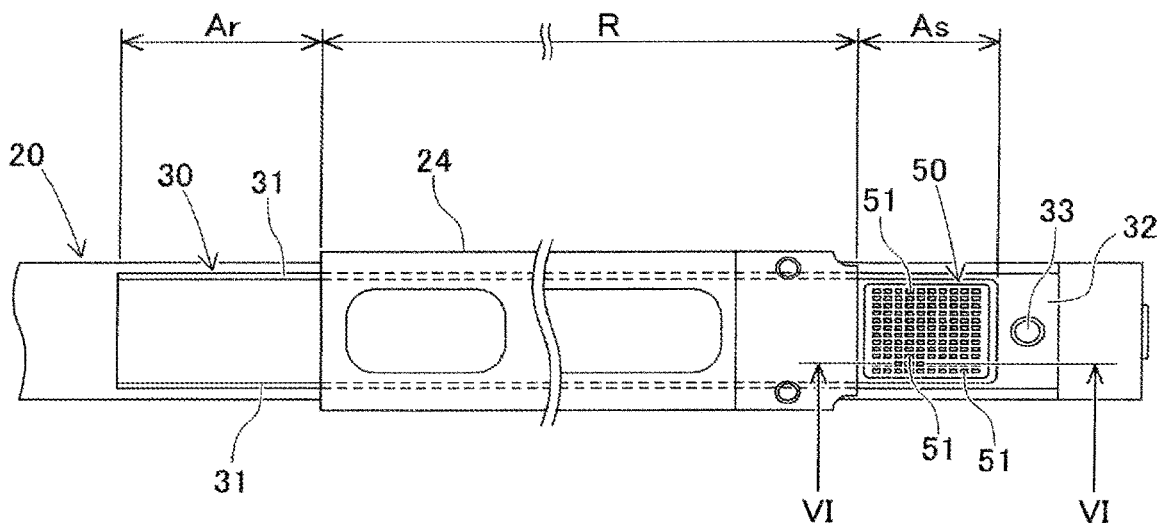
FIG. 4 is a plan view seen from a IV direction of FIG. 3.

Bulk feeder 20 includes track member 30. Track member 30 is provided on the front upper part of feeder main body 21. As shown in FIGS. 3 and 4, track member 30 is formed to extend in a front-rear direction (right-left direction of FIGS. 3 and 4) of feeder main body 21. Pair of side walls 31 protruding upward are formed on both edges of track member 30 in the width direction (up-down direction in FIG. 4). Pair of side walls 31 surround the peripheral edge of conveyance path R together with distal end portion 32 of track member 30 to prevent leakage of components 92 conveyed along conveyance path R. Circular reference mark 33 indicating the reference position of bulk feeder 20 is attached to an upper face of distal end portion 32.

Track member 30 having the configuration described above has reception region Ar, supply region As, and conveyance path R. Here, "reception region Ar" is a region in which components 92 in the bulk state, which are discharged from component case 22, are received. Reception region Ar of the present embodiment is positioned below a discharge port of component case 22. In addition, "supply region As" is a region to which components 92 are supplied. In other words, "supply region As" is a region in which components 92 can be collected by suction nozzle 134 supported by mounting head 133, and is included in the movable range of mounting head 133.

In addition, "conveyance path R" of track member 30 is a path of components 92 from reception region Ar to supply region As. In the present embodiment, conveyance path R is formed in a groove shape in which a groove bottom face is horizontal. A groove side face of conveyance path R is formed by pair of side walls 31. A groove opening on an upper side of conveyance path R is largely closed by cover 24. Track member 30 is supported to be slightly displaceable (that is, can vibrate) with respect to feeder main body 21 in a virtual vertical plane formed in the front-rear direction and the up-down direction.

2-4. Vibration Device 40

Bulk feeder 20 includes vibration device 40. Vibration device 40 is provided on feeder main body 21. Vibration device 40 applies the vibration to track member 30 such that components 92 on conveyance path R are conveyed. Specifically, vibration device 40 includes multiple first support sections 41, multiple first piezoelectric elements 42, multiple second support sections 43, multiple second piezoelectric elements 44, and driving section 45. First support section 41 and second support section 43 are connecting members that connect feeder main body 21 and track member 30.

First support section 41 is formed in a shape that is inclined and extends forward with respect to the vertical direction. Second support section 43 is formed in a shape that is inclined and extends rearward with respect to the vertical direction. First piezoelectric element 42 and second piezoelectric element 44 vibrate at a frequency corresponding to the power supplied from driving section 45. First piezoelectric element 42 is attached to first support section 41. Second piezoelectric element 44 is attached to second support section 43. In a case where first piezoelectric element 42 vibrates, the vibration is applied to track member 30 via first support section 41. Similarly, in a case where second piezoelectric element 44 vibrates, the vibration is applied to track member 30 via second support section 43.

In addition, amplitude of track member 30 is changed in accordance with the voltage applied to first piezoelectric element 42 or second piezoelectric element 44. Vibration device 40 applies the vibration to track member 30 by causing first piezoelectric element 42 attached to first support section 41 that is inclined forward to vibrate. As a result, vibration device 40 causes track member 30 to execute clockwise elliptical movement in the horizontal direction (the front-rear direction in FIG. 3) orthogonal to the conveyance direction of components 92 in conveyance path R. In this case, vibration device 40 causes track member 30 to vibrate such that external force directed forward and upward is applied to components 92 on conveyance path R.

In addition, vibration device 40 applies the vibration to track member 30 by causing second piezoelectric element 44 attached to second support section 43 that is inclined rearward to vibrate. As a result, vibration device 40 causes track member 30 to execute counterclockwise elliptical movement in the horizontal direction (the front-rear direction in FIG. 3) orthogonal to the conveyance direction of components 92 in conveyance path R. In this case, vibration device 40 causes track member 30 to vibrate such that external force directed rearward and upward is applied to components 92 on conveyance path R.

Driving section 45 changes the frequency of the power supplied to first piezoelectric element 42 and second piezoelectric element 44 and the applied voltage based on a command of feeder control device 70, which will be described below. As a result, the frequency and the amplitude of the vibration applied to track member 30 are adjusted, and a rotation direction of the elliptical movement of track member 30 is determined. In a case where the frequency or the amplitude of the vibration of track member 30 and the rotation direction of the elliptical movement due to the vibration are changed, a conveyance speed of components 92 to be conveyed, a degree of dispersion of components 92, the conveyance direction, and the like are changed.

With the configuration described above, vibration device 40 applies predetermined vibration to track member 30, and multiple components 92 discharged from component case 22 to reception region Ar of track member 30 can be conveyed to supply region As via conveyance path R. In the following, an operation of vibration device 40 of conveying components 92 on conveyance path R in a direction toward supply region As is referred to as a "feeding operation". In addition, an operation of vibration device 40 of conveying components 92 on conveyance path R in a direction toward reception region Ar is referred to as a "returning operation". It should be noted that the elliptical movement of track member becomes reverse rotation by switching between the feeding operation and the returning operation of vibration device 40.

2-5. Alignment Member 50

Bulk feeder 20 includes alignment member 50. Alignment member 50 is provided in supply region As of track member 30. Alignment member 50 guides multiple components 92 conveyed by the vibration of track member 30 and aligns multiple components 92 with respect to feeder main body 21. For alignment member 50 that aligns components 92, for example, the following first to fourth aspects can be adopted.

2-5-1. First Aspect of Alignment Member 50

Figure 5:
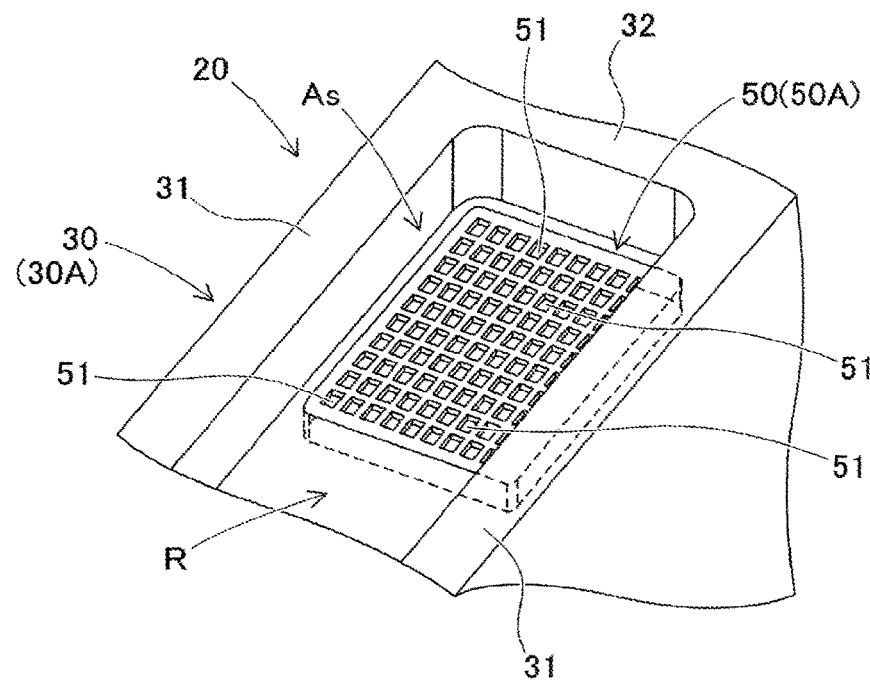
FIG. 5 is a perspective view showing a first aspect of an alignment member in a supply region.

As shown in FIG. 5, alignment member 50A of a first aspect has multiple cavities 51 that individually accommodate multiple components 92. Specifically, multiple cavities 51 are arranged in a matrix in supply region As. For example, alignment member 50A has 120 cavities 51 in total in which 10 cavities are regularly arranged in the conveyance direction and 12 cavities are regularly arranged in the width direction of conveyance path R.

Figure 6:
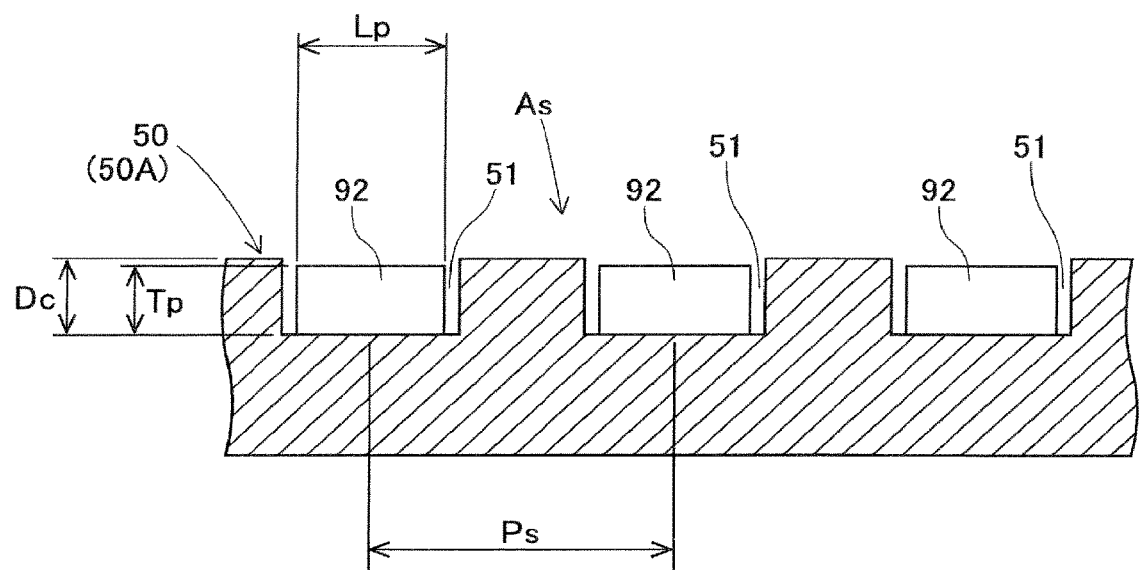
FIG. 6 is an enlarged schematic view showing a cross section of VI-VI of FIG. 4.

In addition, as shown in FIG. 6, each of multiple cavities 51 is open on an upper face of conveyance path R, and accommodates component 92 in a posture in which a thickness direction of component 92 is the up-down direction. The opening of cavity 51 is set to a size slightly larger than an outer shape of component 92 in an upward view. Depth Dc of cavity 51 can be appropriately set in accordance with the type (shape, mass, or the like) of component 92. In a state in which depth Dc of cavity 51 is set shallow and component 92 protrudes from the upper face of conveyance path R, interference between suction nozzle 134 and alignment member 50A in the collection operation can be reliably prevented.

On the other hand, in a state in which depth Dc of cavity 51 is set deep and component 92 is lower than the upper face of conveyance path R, coming out of component 92 once accommodated in cavity 51 again is reduced. Therefore, depth Dc of each of multiple cavities 51 in alignment member 50A of the first aspect is set to be equal to or larger than thickness Tp of component 92. It should be noted that, in a case where depth Dc of cavity 51 is too deep, there is a risk that another component 92 is prevented from moving in the conveyance direction on the upper side of cavity 51 in a state of accommodating component 92.

Therefore, it is preferable that depth Dc of cavity 51 be set such that an upper end of component 92 accommodated in cavity 51 is slightly lower than the upper face of conveyance path R. As described above, the shape (opening, depth, or the like) of cavity 51 is appropriately set. In a case where it is assumed that components 92 are accommodated in the carrier tape and supplied by the tape feeder, the shape of cavity 51 of alignment member 50A of the first aspect is similar to the shape of the cavity formed in the carrier tape.

2-5-2. Second Aspect of Alignment Member 50

Figure 7:
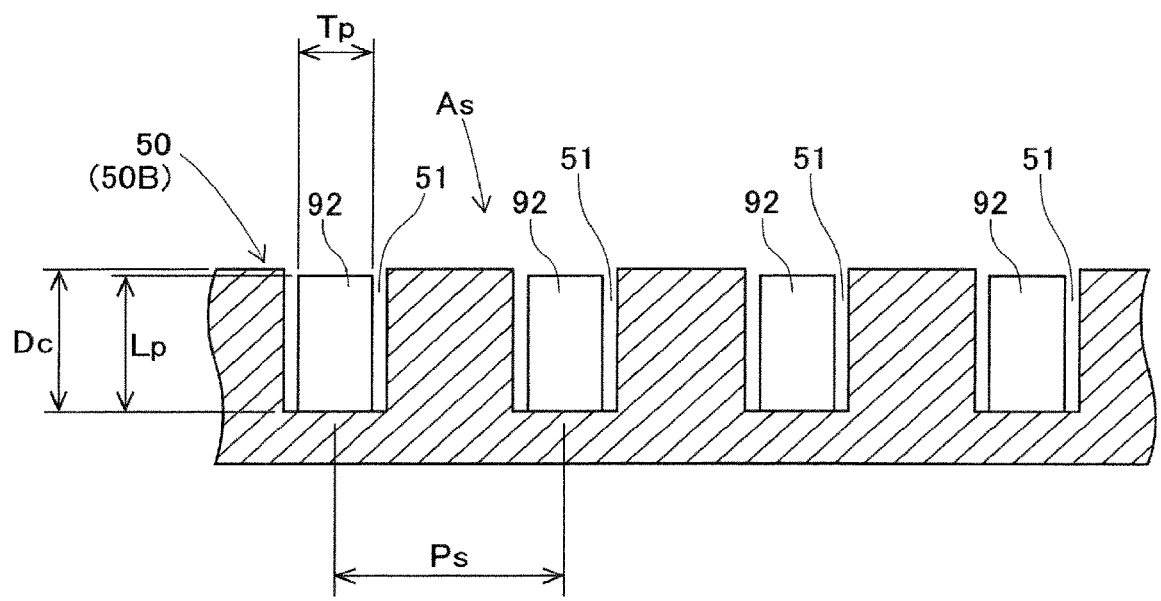
FIG. 7 is a schematic view corresponding to FIG. 6, which shows a second aspect of the alignment member in the supply region.
Figure 8:
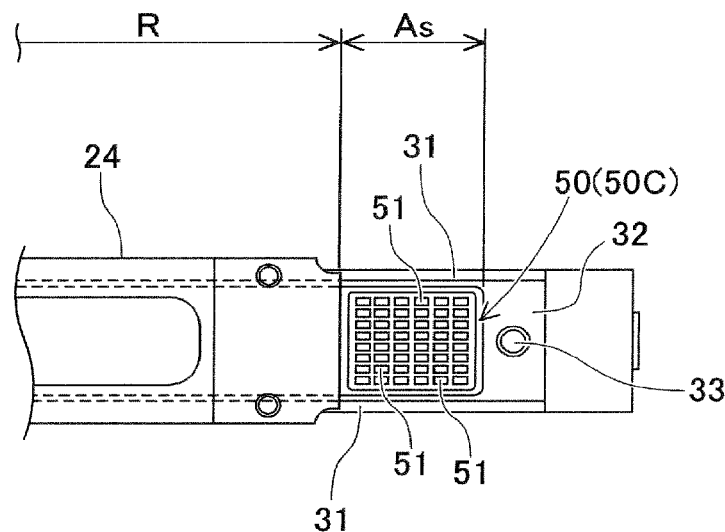
FIG. 8 is a plan view corresponding to FIG. 4, which shows a third aspect of the alignment member in the supply region.

Alignment member 50B of a second aspect has a different storage direction of components 92 from the first aspect. Specifically, as shown in FIG. 7, each of multiple cavities 51 is open on an upper face of conveyance path R, and accommodates component 92 in a posture in which a longitudinal direction of component 92 is the up-down direction. With such a configuration, components 92 can be supplied in the posture described above. In addition, since the opening size of cavity 51 can be reduced, it is possible to arrange a relatively large number of cavities 51 in limited supply region As.

Depth Dc of cavity 51 of alignment member 50B of the second aspect can be appropriately set. For example, the depth of cavity 51 is set to be slightly larger than length Lp in the longitudinal direction of component 92, and the upper end of accommodated component 92 is set to be lower than the upper face of conveyance path R. In addition, in the aspect in which component 92 is accommodated in such a posture, since component 92 once accommodated is relatively stable, depth Dc of cavity 51 may be set such that the upper end of component 92 is higher than the upper face of conveyance path R.

2-5-3. Third Aspect of Alignment Member 50

Alignment member 50C of a third aspect has a different shape and number of cavities 51 from the first aspect. Specifically, alignment member 50C has 48 cavities 51 in total in which 6 cavities are regularly arranged in the conveyance direction and 8 cavities are regularly arranged in the width direction of conveyance path R. Alignment member 50C of the third aspect has cavities 51 having the shape and number described above in order to correspond to components 92 supplied by bulk feeder 20 having a larger size than the first aspect.

It should be noted that, as shown in the first aspect and the third aspect, the shape of cavity 51 is appropriately set in accordance with the shape of component 92 and the accommodating posture. Moreover, in a case where the shape of cavity 51 is set, the occupied area of one cavity 51 in supply region As is determined. Further, the number of cavities 51 in alignment member 50 is appropriately set in consideration of the shape, the required number, and the degree of density of the cavities 51, which can affect the conveyance property.

The number of cavities 51 in alignment members 50A to 50C of the first to third aspects is set to be larger than the maximum number of components 92 collected by the collection operation in one PP cycle. It should be noted that the "maximum number" described above corresponds to the number of suction nozzles 134 supported by mounting head 133. In the present embodiment, since mounting head 133 supports 24 suction nozzles 134, the number of cavities 51 is set to be more than at least 24.

In addition, alignment member 50 including the first to third aspects may be configured to have a magnet (not shown) acting on component 92 positioned on the upper part or component 92 accommodated in cavity 51. Specifically, the magnet is embedded in a portion deeper than the bottom of cavity 51. In a case where magnetic force of the magnet is large enough to act on the upper part of alignment member 50, the magnet guides component 92 into cavity 51 by the magnetic force. As a result, components 92 are efficiently accommodated in multiple cavities 51.

In addition, in a case where the magnetic force of the magnet does not act on the upper part of alignment member 50 but acts on component 92 accommodated in cavity 51, the magnet holds component 92 accommodated in cavity 51 by the magnetic force. As a result, it is possible to prevent component 92 once accommodated from coming out. It should be noted that the magnet described above may be a permanent magnet or an electromagnet. In addition, the magnet may be a magnetized material disposed at the bottoms of multiple cavities 51. Further, the magnets may be disposed for each of multiple cavities 51, or may be disposed to act on a part or all of multiple cavities 51.

2-5-4. Fourth Aspect of Alignment Member 50

Figure 9:
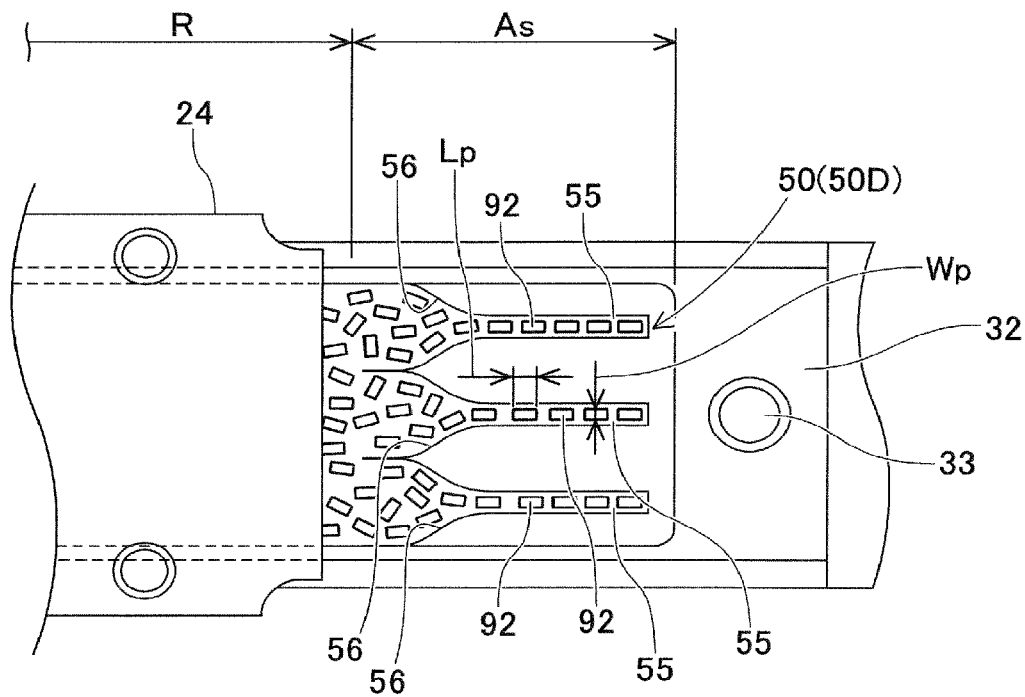
FIG. 9 is a plan view corresponding to FIG. 4, which shows a fourth aspect of the alignment member in the supply region in an enlarged manner.

Alignment member 50D of a fourth aspect has multiple alignment grooves 55 and multiple guide portions 56 in place of cavities 51. As shown in FIG. 9, each of multiple alignment grooves 55 is formed to extend in the conveyance direction. A groove width of alignment groove 55 is formed to be slightly wider than width Wp of component 92 and shorter than length Lp of component 92.

Each of multiple guide portions 56 communicates with a rear side of alignment groove 55 in the conveyance direction, and is formed in a funnel shape in which the opening width is increased toward the rear side in the conveyance direction. With such a configuration of alignment member 50D of the fourth aspect, components 92 conveyed by the feeding operation are guided to alignment grooves 55 as components 92 are conveyed to the front side in the conveyance direction. In a case where components 92 are further conveyed to the front side in the conveyance direction, components 92 are aligned such that the longitudinal direction faces the conveyance direction.

Multiple components 92 are sequentially conveyed in a state of being accommodated in alignment grooves 55 until multiple components 92 reach a front end of alignment grooves 55. With such a configuration, multiple aligned components 92 can be sequentially supplied along alignment grooves 55. In addition, alignment member 50D may further have a regulating member that regulates the conveyance of component 92 on the upper side in a case where components 92 are deposited on each other. As a result, multiple components 92 can be aligned.

2-6. Feeder Control Device 70

Bulk feeder 20 includes feeder control device 70. Feeder control device 70 is mainly composed of CPU, various memories, or a control circuit. Feeder control device 70 is supplied with the power via connector 211, and is capable of communicating with control device 16 of component mounting machine 10 in a state in which bulk feeder 20 is set in slot 121.

As shown in FIG. 3, feeder control device 70 includes storage section 71. Storage section 71 is composed of a flash memory or the like. Storage section 71 stores various data, such as a program used for controlling the component supplying process or conveyance parameter F1. "Conveyance parameter F1" described above is a parameter for controlling the operation of vibration device 40 such that the vibration applied to track member 30 is appropriate in a case where components 92 are conveyed in the component supplying process, and is set in advance in association with the types of components 92, for example.

Feeder control device 70 includes conveyance control section 72. Conveyance control section 72 controls the operation of vibration device 40 and executes the feeding operation and the returning operation described above. Specifically, conveyance control section 72 sends a command to driving section 45 of vibration device 40 in a case of executing the feeding operation. As a result, by driving section 45 supplying predetermined power to first piezoelectric element 42, the vibration is applied to track member 30 via first support section 41. As a result, components 92 on conveyance path R are conveyed by receiving the external force to move to the front side in the conveyance direction.

In addition, conveyance control section 72 realizes various conveyance aspects by combining the execution time of the feeding operation and the returning operation of vibration device 40, or the like. For example, in a case where alignment member 50 has multiple cavities 51, conveyance control section 72 may execute an accommodation step and a retraction step as described below. The "accommodation step" described above is a step of accommodating components 92 in at least a part of multiple cavities 51 by executing the feeding operation until at least a part of multiple components 92 on conveyance path R reaches supply region As.

In this case, conveyance control section 72 may repeatedly execute the feeding operation and the returning operation and may retain multiple components 92 in supply region As in a state in which track member 30 vibrates after at least a part of multiple components 92 on conveyance path R reaches the supply region As, in the accommodation step. In addition, the "retraction step" described above is a step of retracting remaining components 92 from supply region As toward reception region Ar by executing the returning operation in a state in which at least a part of multiple components 92 on conveyance path R is accommodated in multiple cavities 51, after executing the accommodation step.

Conveyance control section 72 can appropriately set the execution time of the feeding operation or the returning operation in each step, the time of the retention operation in the accommodation step, and the number of executions of the repetitive operation. In addition, in accordance with the number of remaining components 92 on conveyance path R, the retention operation in the accommodation step or the retraction step may be omitted. Further, conveyance control section 72 may adjust at least one of the frequency and the amplitude of the vibration applied to track member 30 by vibration device 40 in accordance with the type of components 92 accommodated in component case 22.

Specifically, in a case where component case 22 is attached to bulk feeder 20, the types of components 92 replenished in component case 22 and identification information of bulk feeder 20 are verified. Moreover, in a case where bulk feeder 20 is set in slot 121, conveyance control section 72 acquires parameters in accordance with the types of components 92 from conveyance parameter F1. As a result, conveyance control section 72 adjusts the command to be sent to driving section 45 of vibration device 40.

As a result, the frequency or the like of the vibration applied to track member 30 by vibration device 40 is adjusted in accordance with the types of the components. A configuration may be adopted in which conveyance parameter F1 described above is appropriately switched in accordance with various aspects adopted for alignment member 50 in addition to the types of components 92. As a result, the accommodation step, the retention operation, or the retraction step is suitably executed. Further, conveyance parameter F1 may be updated by an administrator based on the result (including the success rate or the like) of the component supplying process executed in the past.

3. Exchangeability of Alignment Member 50 and Track Member 30

Figure 10:
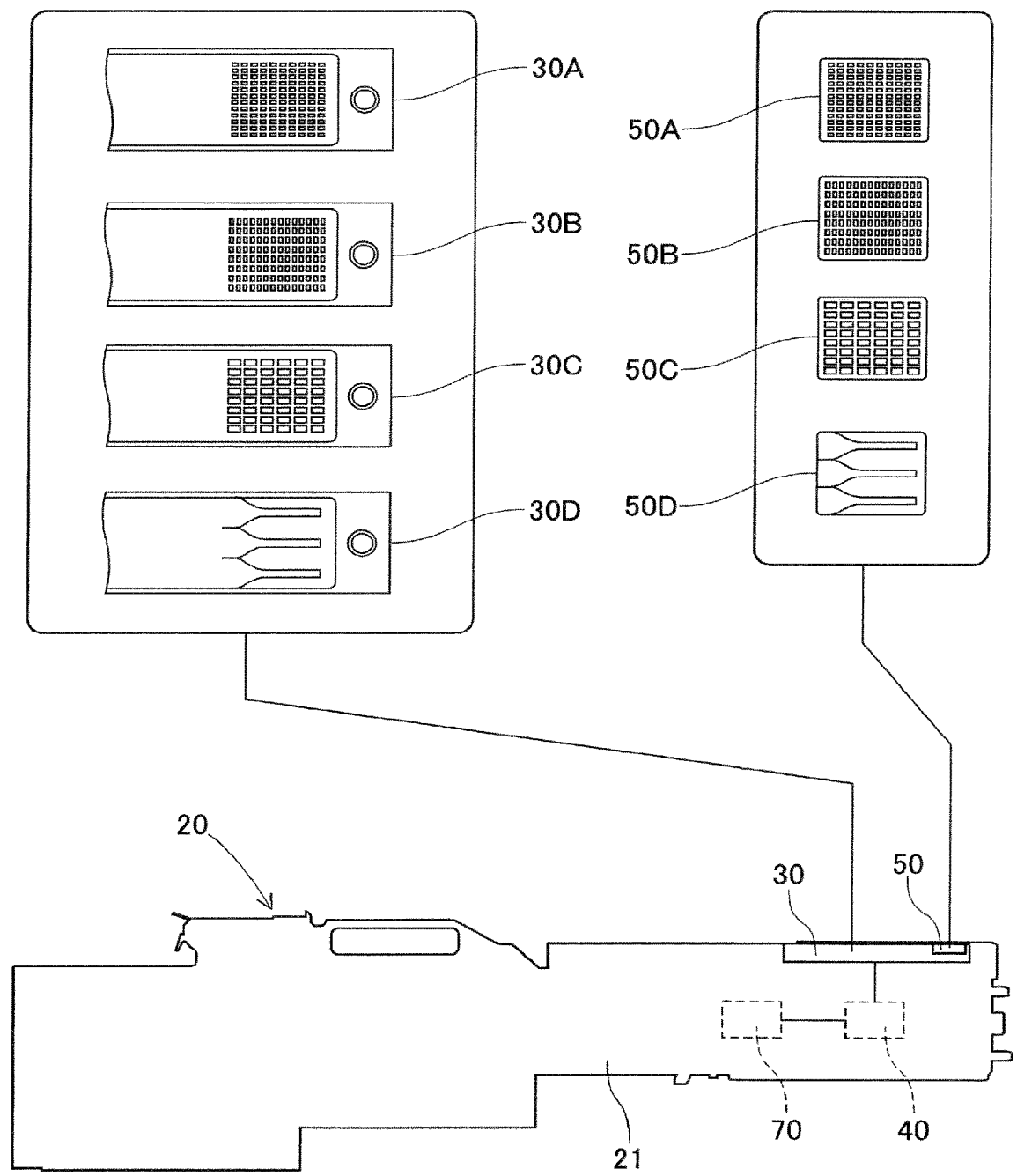
FIG. 10 is a conceptual view showing a configuration in which a track member or the alignment member can be selectively attached to the bulk feeder.

Here, a configuration may be adopted in which alignment member 50 of bulk feeder 20 is attached to track member 30 to be exchangeable. Specifically, in a case of setting up bulk feeder 20, as shown in FIG. 10, for example, multiple types of alignment members 50A to 50D corresponding to the first to fourth aspects are prepared to be exchangeable. Moreover, in bulk feeder 20, one selected from multiple types of alignment members 50A to 50D having different shapes from each other corresponding to the types of components 92 to be supplied is attached to track member 30.

With such a configuration, bulk feeder 20 can share feeder main body 21, track member 30, or vibration device 40, and can handle the types or the supply aspects of components 92 by exchanging alignment member 50. As a result, a range of use of bulk feeder 20 can be enlarged, and a production cost of the board product can be reduced.

Further, a configuration may be adopted track member 30 of bulk feeder 20 is attached to feeder main body 21 to be exchangeable. In this case, alignment member 50 may be formed integrally with track member 30, or may be exchangeable. Specifically, in a case of setting up bulk feeder 20, as shown in FIG. 10, for example, multiple types of track members 30A to 30D on which multiple types of alignment members 50A to 50D corresponding to the first to fourth aspects are formed are prepared to be exchangeable.

Moreover, in bulk feeder 20, one selected from multiple types of track members 30A to 30D on which one of multiple types of alignment members 50A to 50D having different shapes corresponding to the type of components 92 to be supplied is formed is attached to feeder main body 21. With such a configuration, bulk feeder 20 can share feeder main body 21 or vibration device 40, and can handle the types or the supply aspects of components 92 by exchanging track member 30. As a result, a range of use of bulk feeder 20 can be enlarged, and a production cost of the board product can be reduced.

4. Mounting Process by Component Mounting Machine 10

Figure 11:
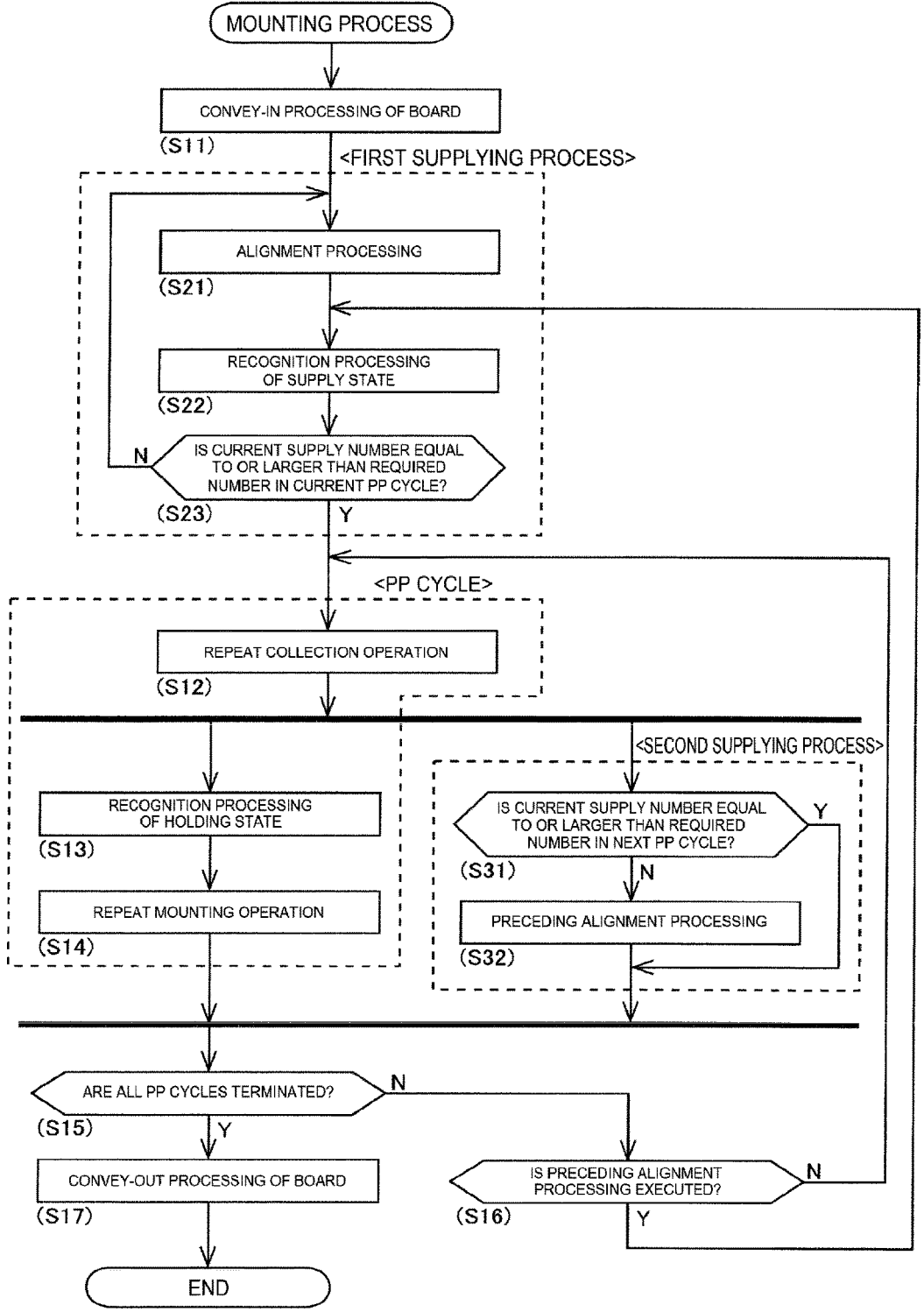
FIG. 11 is a flowchart showing a mounting process by the component mounting machine.
Figure 12:
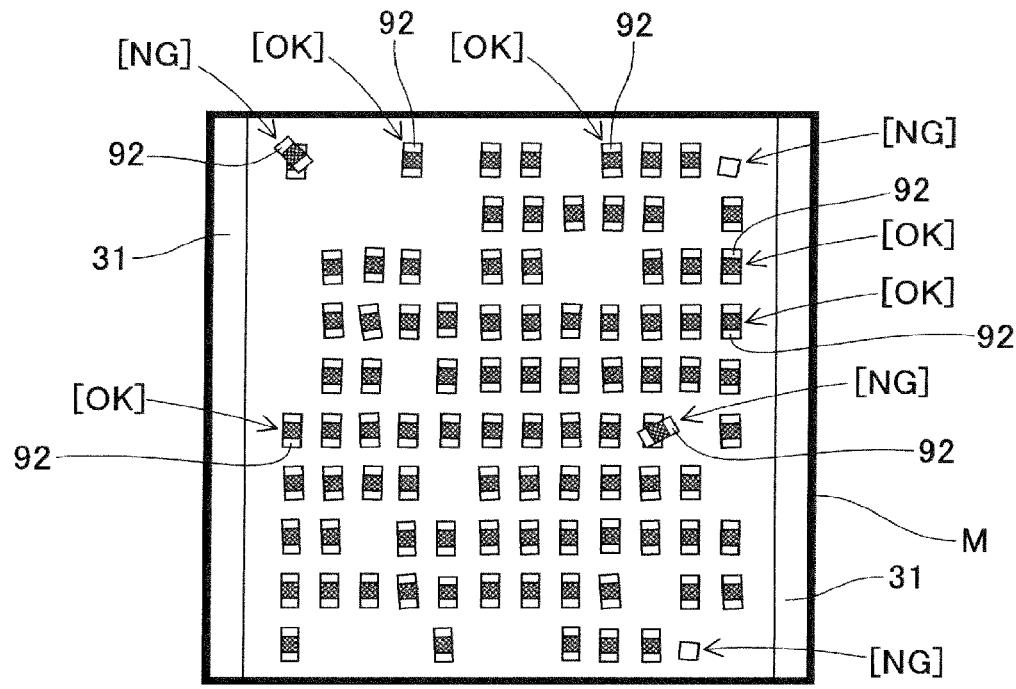
FIG. 12 is a view showing image data used for recognition processing of a supply state of components in the supply region.

The mounting process by component mounting machine 10 will be described with reference to FIGS. 11 and 12. Here, a configuration is adopted in which bulk feeder 20 includes alignment member 50 in which multiple cavities 51 are formed in a matrix. In addition, after bulk feeder 20 described above is set in slot 121, control device 16 executes calibration processing and recognizes the position of alignment member 50 in the machine.

In the calibration processing described above, control device 16 first moves board camera 15 above reference mark 33 of bulk feeder 20 and acquires the image data by the imaging of board camera 15. Moreover, control device 16 recognizes the position of alignment member 50 in the machine based on the position of reference mark 33 included in the image data by the image processing and the position of board camera 15 when the image is captured.

In addition, control device 16 includes arrangement information indicating the shape of alignment member 50 included in bulk feeder 20, that is, a positional relationship of multiple cavities 51. Control device 16 may acquire the arrangement information described above from feeder control device 70 of bulk feeder 20, or may acquire the arrangement information from a host device or the like in accordance with the type of alignment member 50 identified based on the image data acquired by imaging reference mark 33. Control device 16 recognizes the position of alignment member 50, specifically the position of individual cavity 51, by the calibration processing.

In the mounting process, first, board conveyance device 11 of component mounting machine 10 executes convey-in processing of board 91 (S11). As a result, board 91 is conveyed in the machine and is positioned at a predetermined position in the machine. Control device 16 executes a first component supplying process by bulk feeder 20 after S11 or in parallel with S11. Specifically, first, control device 16 causes bulk feeder 20 to execute alignment processing of aligning components 92 in supply region As (S21). As a result, conveyance control section 72 of bulk feeder 20 executes the accommodation step or the retraction step described above.

Next, control device 16 executes the recognition processing the supply state of components 92 in supply region As (S22). Specifically, control device 16 first moves board camera 15 above alignment member 50 in supply region As of bulk feeder 20, and acquires image data M by the imaging of board camera 15. Moreover, as shown in FIG. 12, control device 16 executes predetermined image processing on image data M and recognizes components 92 accommodated in multiple cavities 51, respectively.

Specifically, control device 16 determines whether components 92 can be collected based on the positions of multiple cavities 51 recognized by the calibration processing and the posture of components 92 in image data M subjected to the image processing. Specifically, control device 16 determines that components 92 appropriately accommodated in cavities 51 can be collected ("OK" in FIG. 12). Control device 16 determines that components 92 accommodated in an inappropriate posture, such as a tilted posture, in cavities 51 or multiple components 92 in a state of being deposited on each other cannot be collected ("NG" in FIG. 12).

As described above, in the recognition processing of the supply state (S22), control device 16 recognizes the supply state indicating whether components 92 are accommodated in multiple cavities 51 to be collectable by the image processing on image data M. It should be noted that, in addition to this, control device 16 may recognize the positions of components 92 by using components 92 that can be collected as targets. That is, control device 16 calculates a coordinate value of the reference position.

The "reference position" described above of the components that can be collected is a position optionally set on the upper face of component 92, and is set to, for example, a center, a centroid, or a flat region of component 92 suitable for pick-up by suction nozzle 134 in a case where suction nozzle 134 is used for the collection operation. In the image processing, control device 16 calculates the coordinate value of the reference position in the component that can be collected by recognizing, for example, the outer shape, or the center position of the component that can be collected.

Subsequently, in a case where the number (supply number) of components 92 that can be collected is less than the number of components 92, which is scheduled to be collected in the current PP cycle, in the result of the recognition processing (S22) of the supply state (S23: No), control device 16 cause bulk feeder 20 to execute the alignment processing (S21) again. For example, in a case where components 92 supplied by bulk feeder 20 are collected by 20 suction nozzles 134 among 24 suction nozzles 134 in the collection operation of the current PP cycle, the number (required number) of components 92, which is scheduled to be collected, is 20.

As described above, in a case where the required number of components 92 cannot be collected in the current PP cycle in the current supply state of components 92 in supply region As, control device 16 repeatedly executes the alignment processing (S21) and the recognition processing of the supply state (S22). It should be noted that in a case where the required number is large, the current supply number of components 92 may be first collected out of the required number thereof, and then the alignment processing (S21) and the recognition processing of the supply state (S22) may be executed to try the collection again.

On the other hand, in a case where the current supply number is equal to or larger than the required number in the current PP cycle (S23: Yes), control device 16 executes the PP cycle. In the PP cycle, control device 16 repeatedly executes the collection operation of collecting the components using multiple suction nozzles 134 (S12). In this case, control device 16 controls the operation of mounting head 133 in the collection operation to sequentially position mounting head 133 in accordance with the positions of components 92 that can be collected based on the result of the recognition processing of the supply state (S22).

Here, it is assumed that the result of the recognition processing of the supply state (S22) indicates whether component 92 that can be collected is present for each of multiple cavities 51. In this case, in the collection operation, control device 16 controls the operation of mounting head 133 to position suction nozzle 134 at the center of cavity 51 that accommodates component 92 to be collectable. In addition, in a case where the result of the recognition processing of the supply state (S22) includes the coordinate value of the reference position in the component that can be collected, control device 16 may control the operation of mounting head 133 to position suction nozzle 134 to the coordinate value of the reference position described above, not the center of cavity 51.

Subsequently, control device 16 executes the recognition processing of the holding state of components 92 held by multiple suction nozzles 134 (S13). Specifically, control device 16 moves mounting head 133 above part camera 14 and sends an imaging command to part camera 14. Control device 16 executes the image processing on the image data acquired by the imaging of part camera 14 to recognize the posture (position and angle) of component 92 held by each of multiple suction nozzles 134.

Thereafter, control device 16 repeatedly executes the mounting operation of mounting the components using multiple suction nozzles 134 (S14) It should be noted that in mounting operation (S14), control device 16 controls the operation of mounting head 133 to mount components 92 at the mounting positions designated by the control program. Further, mounting head 133 controls the operation of mounting head 133 such that suction nozzle 134 is positioned and angled with respect to the mounting position based on the result of the recognition processing (S13).

In addition, control device 16 causes bulk feeder 20 to execute the alignment processing of aligning components 92 in supply region As in a period from termination of the collection operation (S12) of the current PP cycle described above to start of the collection operation (S12) of the next PP cycle (second component supplying process). Specifically, after the collection operation (S12) of the current PP cycle is terminated, in a case where the current supply number is less than the required number in next PP cycle (S31: No), control device 16 causes bulk feeder 20 execute the preceding alignment processing (S32). Since this preceding alignment processing (S32) is the same as the alignment processing (S21), the detailed description thereof will be omitted.

On the other hand, in a case where the current supply number is equal to or larger than the required number in the next PP cycle (S31: Yes) or after the alignment processing (S32) is executed, control device 16 terminates the second component supplying process executed in parallel with the current PP cycle. Control device 16 determines whether all the PP cycles are terminated based on the control program (S15). In a case where all the PP cycles are not terminated (S15: No), control device 16 determines whether the preceding alignment processing (S32) is executed during the execution of the immediately preceding PP cycle (S16).

In a case where the preceding alignment processing (S32) is executed (S16: Yes), since the current state of supply region As is unknown, control device 16 executes the recognition processing of the supply state (S22) in the first component supplying process again, and then executes the next PP cycle (S12 to S14). On the other hand, in a case where the preceding alignment processing (S32) is not executed (S16: No), the first component supplying process is omitted and the next PP cycle (S12 to S14) is executed.

As described above, in accordance with the number of cavities 51, the number (supply number) of components 92 that can be collected in the result of the recognition processing of the supply state (S22) in the first component supplying process may be equal to or larger than the sum of the number of components 92 which is scheduled to be collected in the current PP cycle and in the next PP cycle. In such a case, control device 16 omits the execution of the alignment processing (S21) for the next PP cycle scheduled after the collection operation of the current PP cycle is terminated. Further, control device 16 controls the operation of mounting head 133 of the collection operation (S12) of the next PP cycle based on the result of the recognition processing of the supply state (S22) executed previously.

In a case where all the PP cycles are terminated (S15: Yes), control device 16 executes convey-out processing of board 91 (S17). In the convey-out processing of board 91, board conveyance device 11 unclamps positioned board 91 and conveyed board 91 out of the outside of component mounting machine 10.

With such a configuration, bulk feeder 20 aligns multiple components 92 in supply region As by using alignment member 50. As a result, it is possible to efficiently supply components 92 in supply region As without enlarging supply region As to secure the supply number of components 92 that can be collected. As a result, it is possible to suitably supply multiple components 92 to be collectable while reducing the size of bulk feeder 20 in the width direction. In addition, since the components are aligned in supply region As, the load of the recognition processing of the supply state (S22) of components 92 in supply region As can be reduced as compared with the configuration in which the components are supplied in the bulk state.

5. Modification Aspect of Embodiment

Figure 13:
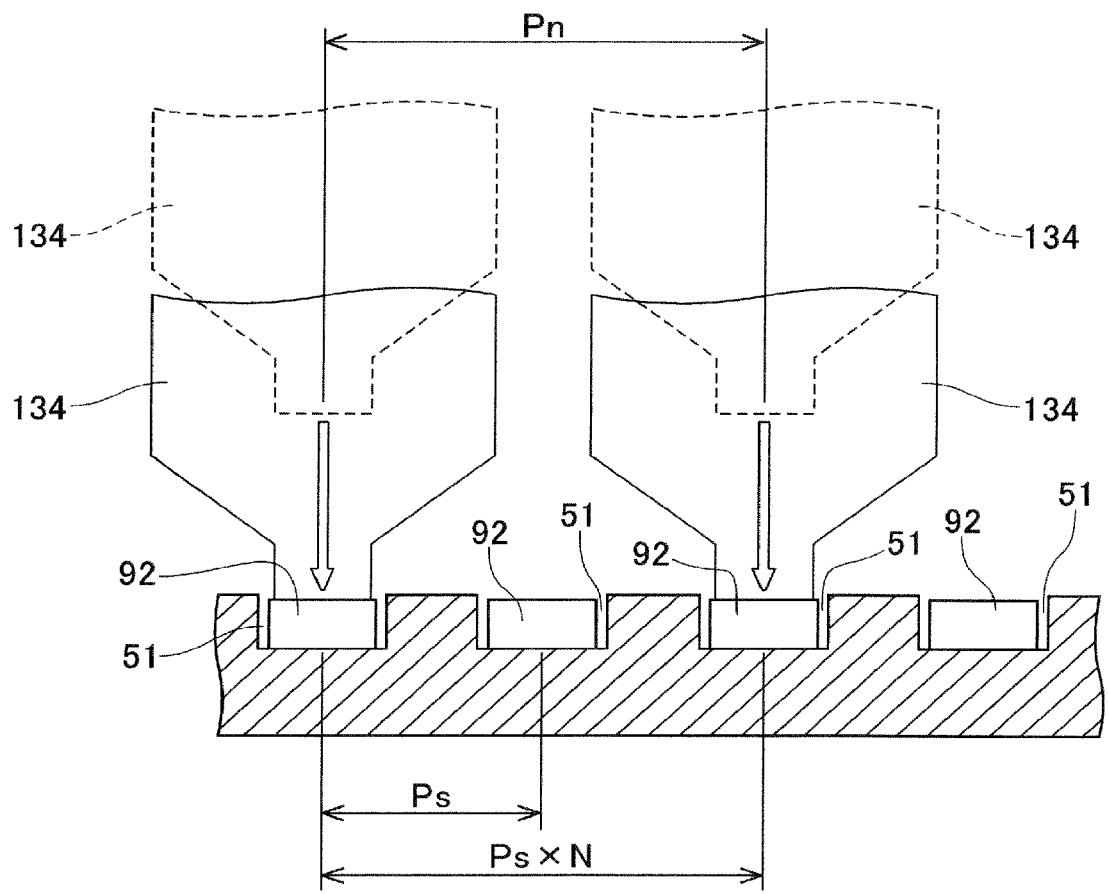
FIG. 13 is a view showing an aspect in which multiple suction nozzles execute a collection operation of the components at the same time in a modification aspect of the embodiment.

In the embodiment, mounting head 133 is configured to include the rotary head that supports multiple suction nozzles 134 to be able to be raised and lowered. On the other hand, as shown in FIG. 13, mounting head 133 may support two suction nozzles 134 to be able to be raised and lowered independently and at a predetermined interval (nozzle pitch Pn). In addition, alignment member 50 of bulk feeder 20 aligns multiple components 92 at defined interval Ps in supply region As.

In the configuration described above, mounting head 133 supports two suction nozzles 134 such that nozzle pitch Pn is an interval of an integral multiple (N) of defined interval Ps. Moreover, in the collection operation (S12), control device 16 collects two components 92 by operating mounting head 133 such that at least parts of raising and lowering of two suction nozzles 134 overlap in a state of maintaining a position of mounting head 133 in the horizontal direction.

With such a configuration, since component mounting machine 10 can simultaneously execute, for example, the raising and lowering operation of multiple suction nozzles 134 in the collection operation of the PP cycle, the required time for the collection operation can be shortened. In addition, in the configuration in which mounting head 133 is provided with the rotary head, in a case of a configuration in which multiple raising and lowering devices that raise and lower two suction nozzles 134 are provided, the same collection operation as described above can be executed.

REFERENCE SIGNS LIST

10: component mounting machine, 12: component supply device, 13: component transfer device, 133: mounting head, 134: suction nozzle (holding member), 14: part camera, 15: board camera, 16: control device, 20: bulk feeder, 21: feeder main body, 22: component case, 30, 30A to 30D: track member, 40: vibration device, 50, 50A to 50D: alignment member, 51: cavity, 55: alignment groove, 56: guide portion, 70: feeder control device, 72: conveyance control section, 91: board, 92: component, Ar: reception region, As: supply region, R: conveyance path, Dc: depth (of cavity), Ps: defined interval (of cavity), Pn: nozzle pitch (interval of suction nozzle (holding member)), F1: conveyance parameter, M: image data, Tp: thickness (of component), Wp: width (of component), Lp: length (of component)

The invention claimed is:
1. A bulk feeder comprising:
a feeder main body;
a track member on an upper part of the feeder main body, the track member including:
a reception region in which components are received from a component case accommodating the components in a bulk state,
a supply region to which the components are supplied, and
a conveyance path of the components from the reception region to the supply region;
a vibration device connected to the feeder main body, the vibration device configured to apply vibration to the track member to convey the components on the conveyance path; and
an alignment member in the supply region of the track member, the alignment member configured to align the components conveyed by the vibration of the track member by the vibration device with respect to the feeder main body, and the alignment member including cavities individually accommodating the components.
2. The bulk feeder according to claim 1,
wherein the cavities are arranged in a matrix in the supply region.
3. The bulk feeder according to claim 1,
wherein each of the cavities is open on an upper face of the conveyance path.
4. The bulk feeder according to claim 1,
wherein the alignment member has a magnet configured to guide the components into the cavities by magnetic force or hold the components accommodated in the cavities by the magnetic force.
5. The bulk feeder according to claim 1,
wherein the alignment member is attached to the track member to be exchangeable.
6. The bulk feeder according to claim 1,
wherein the alignment member is formed integrally with the track member,
the track member is attached to the feeder main body to be exchangeable.
7. A component mounting machine comprising:
a bulk feeder comprising:
a feeder main body,
a track member on an upper part of the feeder main body, the track member including:
a reception region in which components are received from a component case accommodating the components in a bulk state,
a supply region to which the components are supplied, and
a conveyance path of the components from the reception region to the supply region,
a vibration device connected to the feeder main body, the vibration device configured to apply vibration to the track member to convey the components on the conveyance path, and
an alignment member in the supply region of the track member, the alignment member configured to align the components conveyed by the vibration of the track member by the vibration device with respect to the feeder main body, and the alignment member including cavities individually accommodating the components;
a mounting head provided to be movable in a horizontal direction and configured to support multiple holding members, which are configured to hold the components supplied by the bulk feeder, respectively, to be raised and lowered; and
a control device configured to control operations of the bulk feeder and the mounting head and repeatedly execute a pick and place cycle including a collection operation of collecting the components from the bulk feeder and a mounting operation of mounting the components on a board.

8. The component mounting machine according to claim 7, further comprising:
a camera configured to image the supply region,
wherein the control device is configured to execute recognition processing of recognizing a supply state of the components in the supply region based on image data acquired by imaging of the camera and control the operation of the mounting head in the collection operation based on a result of the recognition processing of the supply state.

9. The component mounting machine according to claim 8,
wherein the control device is configured to cause the bulk feeder to execute alignment processing of aligning the components in the supply region in a period from termination of the collection operation of a current pick and place cycle to start of the collection operation of a next pick and place cycle.

10. The component mounting machine according to claim 9,
wherein the control device is configured to omit execution of the alignment processing scheduled after the collection operation of the current pick and place cycle is terminated and control the operation of the mounting head in the collection operation of the next pick and place cycle based on the result of the recognition processing of the supply state, in a case where the number of collectable components in the result of the recognition processing of the supply state is equal to or larger than a sum of the numbers of the components scheduled to be collected in the current pick and place cycle and in the next pick and place cycle.

11. The component mounting machine according to claim 10,
wherein the control device is configured to cause the bulk feeder to execute the alignment processing again, in a case where the number of collectable components in the result of the recognition processing of the supply state is less than the number of the components scheduled to be collected in the current pick and place cycle.

12. The component mounting machine according to claim 8,
wherein the alignment member has multiple cavities individually accommodating the components, and
the control device is configured to recognize the supply state indicating whether the components are accommodated in the multiple cavities to be collectable by image processing on the image data, in the recognition processing of the supply state.

13. The component mounting machine according to claim 12,
wherein the mounting head is configured to support a suction nozzle configured to pick up the component by negative pressure air, and
the control device is configured to control the operation of the mounting head to position the suction nozzle at a center of the cavity accommodating the component to be collectable, in the collection operation.

14. The component mounting machine according to claim 7,
wherein the alignment member is configured to align the components in the supply region at a defined interval,
the mounting head is configured to support two holding members at an interval of an integral multiple of the defined interval, and
the control device is configured to collect two components by operating the mounting head such that at least parts of raising and lowering of the two holding members overlap in a state of maintaining a position of the mounting head in the horizontal direction in the collection operation.

* * * * *